United States Patent
Lee et al.

(10) Patent No.: US 10,553,678 B2
(45) Date of Patent: Feb. 4, 2020

(54) VERTICALLY STACKED DUAL CHANNEL NANOSHEET DEVICES

(71) Applicant: International Business Machines Corporation, Armonk, NY (US)

(72) Inventors: Choonghyun Lee, Rensselaer, NY (US); Jingyun Zhang, Albany, NY (US); Pouya Hashemi, White Plains, NY (US); Takashi Ando, Tuckahoe, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/802,021

(22) Filed: Nov. 2, 2017

(65) Prior Publication Data

US 2019/0131395 A1    May 2, 2019

(51) Int. Cl.
*H01L 29/06* (2006.01)
*H01L 27/092* (2006.01)
(Continued)

(52) U.S. Cl.
CPC .... *H01L 29/0673* (2013.01); *H01L 21/02112* (2013.01); *H01L 21/02164* (2013.01);
(Continued)

(58) Field of Classification Search
CPC ............ H01L 29/0673; H01L 29/0653; H01L 29/0847; H01L 29/16; H01L 29/161; H01L 29/1033; H01L 29/42392; H01L 29/4908; H01L 29/66545; H01L 29/66553; H01L 29/66742; H01L 29/78651; H01L 29/78684; H01L 21/02112; H01L 21/02164; H01L 21/02236; H01L 21/02255; H01L 21/02532; H01L 21/28088; H01L 21/28556; H01L 21/30604; H01L 21/31116; H01L 21/324; H01L 21/823814; H01L 21/823828; H01L 21/823871; H01L 21/823878; H01L 21/84; H01L 27/092; H01L 27/1203
(Continued)

(56) References Cited

U.S. PATENT DOCUMENTS 5,801,396 A * 9/1998 Chan .................. H01L 27/0605
                                                 257/369
9,354,408 B2    5/2016 Noma et al.
(Continued)

OTHER PUBLICATIONS

U.S. Appl. No. 15/338,515, filed Oct. 31, 2016, Title of Invention: Stacked Complementary Fets Featuring Vertically Stacked Horizontal Nanowires, First Named Inventor: Karthik Balakrishnan, 48 pages.

*Primary Examiner* — Tong-Ho Kim
(74) *Attorney, Agent, or Firm* — Scully, Scott, Murphy & Presser, P.C.; L. Jeffrey Kelly, Esq.

(57) ABSTRACT

A semiconductor structure having electrostatic control and a low threshold voltage is provided. The structure includes an nFET containing vertically stacked and suspended Si channel material nanosheets stacked vertically above a pFET containing vertically stacked and suspended SiGe channel material nanosheets. The vertically stacked nFET and pFET include a single work function metal.

10 Claims, 13 Drawing Sheets

(51) Int. Cl.

| | |
|---|---|
| *H01L 29/161* | (2006.01) |
| *H01L 29/423* | (2006.01) |
| *H01L 29/10* | (2006.01) |
| *H01L 29/08* | (2006.01) |
| *H01L 21/02* | (2006.01) |
| *H01L 21/306* | (2006.01) |
| *H01L 29/66* | (2006.01) |
| *H01L 21/324* | (2006.01) |
| *H01L 21/8238* | (2006.01) |
| *H01L 21/84* | (2006.01) |
| *H01L 27/12* | (2006.01) |
| *H01L 29/786* | (2006.01) |
| *H01L 21/311* | (2006.01) |

(52) U.S. Cl.
CPC .. *H01L 21/02236* (2013.01); *H01L 21/02532* (2013.01); *H01L 21/30604* (2013.01); *H01L 21/324* (2013.01); *H01L 21/823814* (2013.01); *H01L 21/823828* (2013.01); *H01L 21/823871* (2013.01); *H01L 21/823878* (2013.01); *H01L 21/84* (2013.01); *H01L 27/092* (2013.01); *H01L 27/1203* (2013.01); *H01L 29/0653* (2013.01); *H01L 29/0847* (2013.01); *H01L 29/1033* (2013.01); *H01L 29/161* (2013.01); *H01L 29/42392* (2013.01); *H01L 29/66545* (2013.01); *H01L 29/66553* (2013.01); *H01L 29/66742* (2013.01); *H01L 29/78651* (2013.01); *H01L 29/78684* (2013.01); *H01L 21/02255* (2013.01); *H01L 21/31116* (2013.01)

(58) Field of Classification Search
USPC .......................................................... 257/351
See application file for complete search history.

(56) References Cited

U.S. PATENT DOCUMENTS

| | | | |
|---|---|---|---|
| 9,461,114 | B2 | 10/2016 | Obradovic et al. |
| 9,490,323 | B2 | 11/2016 | Rodder et al. |
| 9,659,963 | B2 | 5/2017 | Cheng et al. |
| 9,685,564 | B2 | 6/2017 | Sengupta et al. |
| 9,837,414 | B1* | 12/2017 | Balakrishnan ...... H01L 29/1083 |
| 2015/0372145 | A1* | 12/2015 | Cheng ................ H01L 29/1033 257/288 |
| 2016/0307928 | A1* | 10/2016 | Liu ...................... H01L 27/1211 |
| 2017/0040321 | A1* | 2/2017 | Mitard .............. H01L 29/78684 |
| 2017/0133507 | A1 | 5/2017 | Cheng et al. |
| 2018/0090494 | A1* | 3/2018 | Chao ................... H01L 27/0924 |

* cited by examiner

VERTICALLY STACKED DUAL CHANNEL NANOSHEET DEVICES

BACKGROUND

The present application relates to a semiconductor structure and a method of forming the same. More particularly, the present application relates to a semiconductor structure including an n-type field effect transistor (nFET) containing vertically stacked and suspended Si channel material nanosheets stacked vertically above a p-type field effect transistor (pFET) containing vertically stacked and suspended SiGe channel material nanosheets, and a method of forming the same.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Also, three dimensional (3D) integration by vertically stacking nFETs and pFETs is an attractive approach for 3 nm node and beyond area scaling. Such vertically stacking of nFETs and pFETs combined with nanosheet technology can benefit from device electrostatics control in addition to area scaling. The threshold voltage control of nFETs and pFETs with a single work function metal is difficult as both the nFETs and pFETs have a Si channel. There is thus a need to provide vertically stacked dual channel nFETs and pFETs which can provide low threshold voltage and a single work function metal.

SUMMARY

A semiconductor structure having electrostatic control and a low threshold voltage is provided. The structure includes an nFET containing vertically stacked and suspended Si channel material nanosheets stacked vertically above a pFET containing vertically stacked and suspended SiGe channel material nanosheets. The vertically stacked nFET and pFET include a single work function metal.

In one aspect of the present application, a semiconductor structure is provided. In one embodiment, the semiconductor structure includes a pFET device including a first functional gate structure present on physically exposed surfaces, and between, each SiGe channel material nanosheet of a vertical stack of suspended SiGe channel material nanosheets. The structure further includes an nFET device stacked vertically above the pFET device. The nFET device includes a second functional gate structure present on physically exposed surfaces, and between, each Si channel material nanosheet of a vertical stack of suspended Si channel material nanosheets. In accordance with the present application, the first and second functional gate structures comprise a same work function metal.

In another aspect, a method of forming a semiconductor structure is provided. In one embodiment the method includes forming a vertical stack of a first nanosheet stack of alternating nanosheets of a sacrificial SiGe nanosheet having a first germanium content and a precursor SiGe channel material nanosheet having a second germanium content that is less than the first germanium content, and a second nanosheet stack of alternating nanosheets of a sacrificial SiGe nanosheet having the first germanium content and a Si channel material nanosheet, wherein the vertical stack is present above a semiconductor substrate and beneath a sacrificial gate structure and a dielectric spacer. Next each sacrificial SiGe nanosheet of the first and second nanosheet stacks is recessed. The sacrificial gate structure and each recessed sacrificial SiGe nanosheet of the first and second nanosheet stacks are removed to suspend each Si channel material nanosheet and each precursor SiGe channel material nanosheet and to provide a gate cavity. Next, a germanium oxide layer is formed in the gate cavity and on physically exposed surfaces of each suspended Si channel material nanosheet and each suspended precursor SiGe channel material nanosheet. A condensation anneal is then performed to convert the suspended precursor SiGe channel material nanosheets into suspended SiGe channel material nanosheets having a third germanium content that is greater than the second germanium content. During the condensation anneal, the germanium oxide layer that is located on the suspended precursor SiGe channel material nanosheets is also converted into a silicon dioxide layer. Next, the germanium oxide layer from each suspended Si channel material nanosheet is removed, followed by the removal of the silicon dioxide layer from each suspended SiGe channel material nanosheet. A gate dielectric material is then formed in the gate cavity and on physically exposed surfaces of each suspended Si channel material nanosheet and each suspended SiGe channel material nanosheet. Next, a work function metal is formed in the gate cavity and on the gate dielectric material.

DETAILED DESCRIPTION

Figure 1:
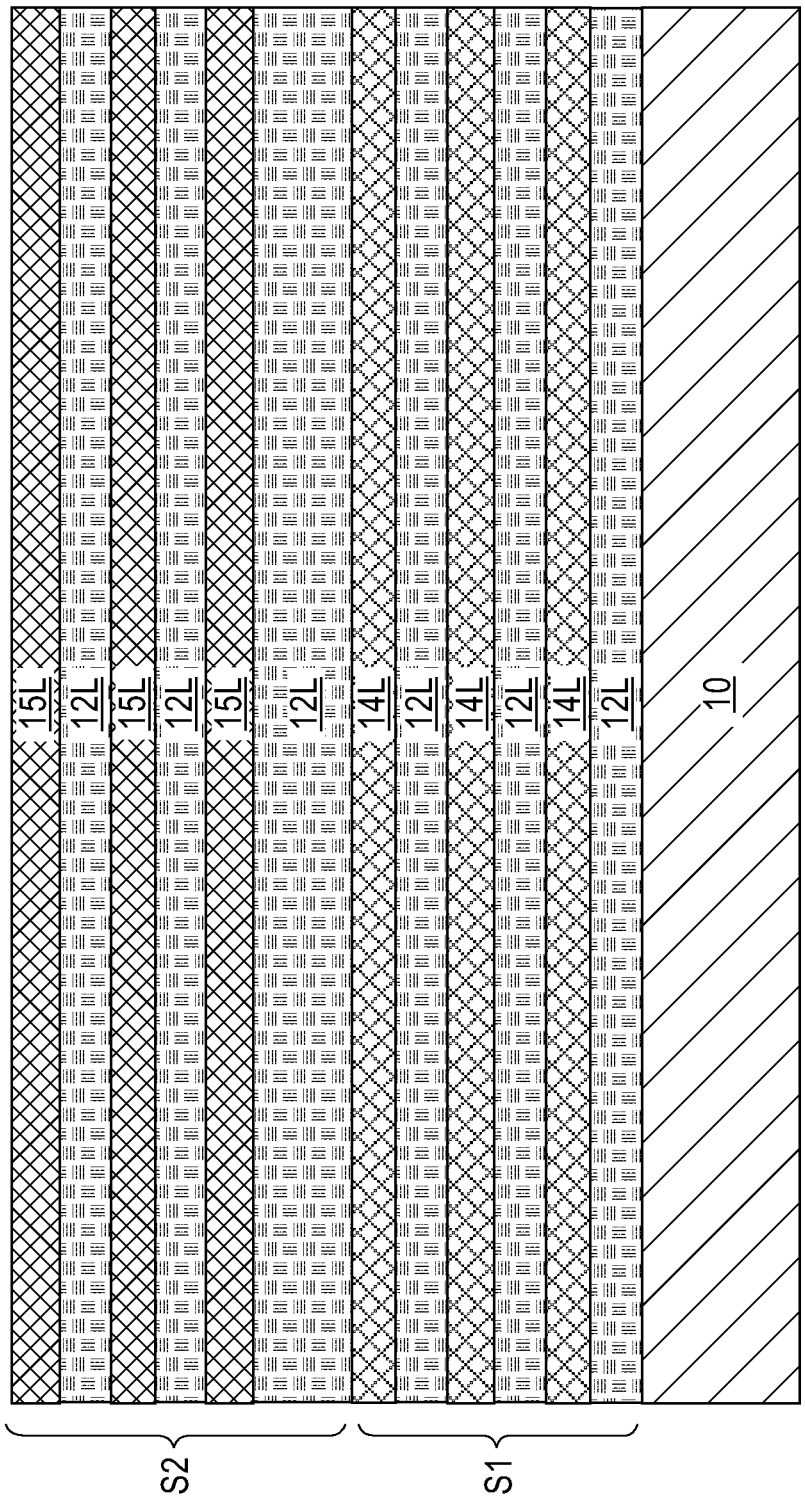
FIG. 1 is a cross sectional view of an exemplary semiconductor structure at an early stage of fabrication in accordance with an embodiment of the present application and including a first semiconductor material stack of alternating layers of a sacrificial silicon germanium (SiGe) layer having a first germanium content and a precursor SiGe channel material layer having a second germanium content that is less than the first germanium content, and a second semiconductor material stack of alternating layers of a sacrificial SiGe layer having the first germanium content and a Si channel material layer, wherein the first semiconductor material stack is located on a topmost surface of a semiconductor substrate, and the second semiconductor material stack is located on a topmost surface of the first semiconductor material stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure at an early stage of fabrication in accordance with an embodiment of the present application. Notably, the exemplary semiconductor structure of FIG. 1 includes a first semiconductor material stack, S1, of alternating layers of a sacrificial silicon germanium (SiGe) layer 12L having a first germanium content and a precursor SiGe channel material layer 14L having a second germanium content that is less than the first germanium content, and a second semiconductor material stack, S2, of alternating layers of a sacrificial SiGe alloy layer 12L having the first germanium content and a S1 channel material layer 15L. As is illustrated in FIG. 1, the first semiconductor material stack, S1, is located on a topmost surface of a semiconductor substrate 10, and the second semiconductor material stack, S2, is located on a topmost surface of the first semiconductor material stack, S1.

In the present application, the first semiconductor material stack, S1, is used in providing vertically stacked and suspended SiGe channel material nanosheets for a pFET device, while the second semiconductor material stack, S2, is used in providing vertically stacked and suspended Si channel material nanosheets for an nFET device.

The semiconductor substrate 10 may include any semiconductor material including, for example, silicon. The term "semiconductor material" is used throughout the present application to denote a material that has semiconducting properties. Besides silicon, the semiconductor material may be germanium (Ge), a silicon germanium alloy (SiGe), silicon carbide (SiC), silicon germanium carbide (SiGeC), III-V compound semiconductors or II-VI compound semiconductors.

The first and second semiconductor material stacks (S1, S2) are then sequentially formed upon the semiconductor substrate 10. As mentioned above, the first semiconductor material stack, S1, includes sacrificial SiGe layers 12L and precursor SiGe channel material layers 14L which alternate one atop the other, while the second semiconductor material stack, S2, includes sacrificial SiGe layers 12L and Si channel material layers 15L which alternate one atop the other. In FIG. 1 and by way of one example, each of the first and second semiconductor material stacks (S1, S2) includes three sacrificial SiGe layers 12L and three channel material layers 14L or 15L. The first and second semiconductor material stacks (S1, S2) that can be employed in the present application are not limited to the specific embodiment illustrated in FIG. 1. Instead, the first and second semiconductor material stacks (S1, S2) can include any number of sacrificial SiGe layers 12L and corresponding channel material layers 14L or 15L so long as each of the first and second semiconductor material stacks (S1, S2) includes at least two sacrificial SiGe layers 12L and two channel material layers 14L of 15L.

Each sacrificial SiGe layer 12L is composed of a silicon germanium alloy having a first germanium content which may range from 20 atomic percent germanium to 40 atomic percent germanium. Each precursor SiGe channel material layer 14L is composed of a silicon germanium alloy having a second germanium content, which is less than the first germanium content. In one example, the second germanium content may range from 10 atomic percent germanium to 25 atomic percent germanium. Each Si channel material layer 15L is composed of unalloyed silicon. The silicon germanium alloy that provides each sacrificial SiGe layer 12L, the silicon germanium alloy that provides each precursor SiGe channel material layer 14L, and the unalloyed silicon that provides each Si channel material layer 15L can be formed utilizing an epitaxial growth (or deposition process) as defined in greater detail herein below.

The first semiconductor material stack, S1, can be formed by sequential epitaxial growth of alternating layers of the SiGe alloy having the first and second germanium contents, respectively, while the second semiconductor material stack, S2, is formed by sequential epitaxial growth of alternating layers of the SiGe alloy having the first germanium content and the unalloyed silicon. Following epitaxial growth of the topmost layer of the second semiconductor material stack, S2, a patterning process may be used to provide the first and second semiconductor material stacks (S1, S2) shown in FIG. 1. Patterning may be achieved by lithography and etching as is well known to those skilled in the art.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growths that are described herein can be performed utilizing any well known precursor gas or gas mixture. Carrier gases like hydrogen, nitrogen, helium and argon can be used.

Each sacrificial SiGe layer 12L may have a thickness from 6 nm to 12 nm, while each precursor SiGe channel material layer 14L and each Si channel material layer 15L may have a thickness from 5 to 12 nm. In the present application, the bottommost sacrificial SiGe layer 12L in the second semiconductor material stack, S2, has a thickness that is generally greater than the thickness of the other sacrificial SiGe layers within the first and second semiconductor material stacks (S1, S2). By providing a thick sacrificial SiGe layer at the bottommost layer of the second semiconductor material stack, S2, sufficient isolation can be provided between the subsequently formed vertically stacked pFET and nFET device regions.

Figure 2:
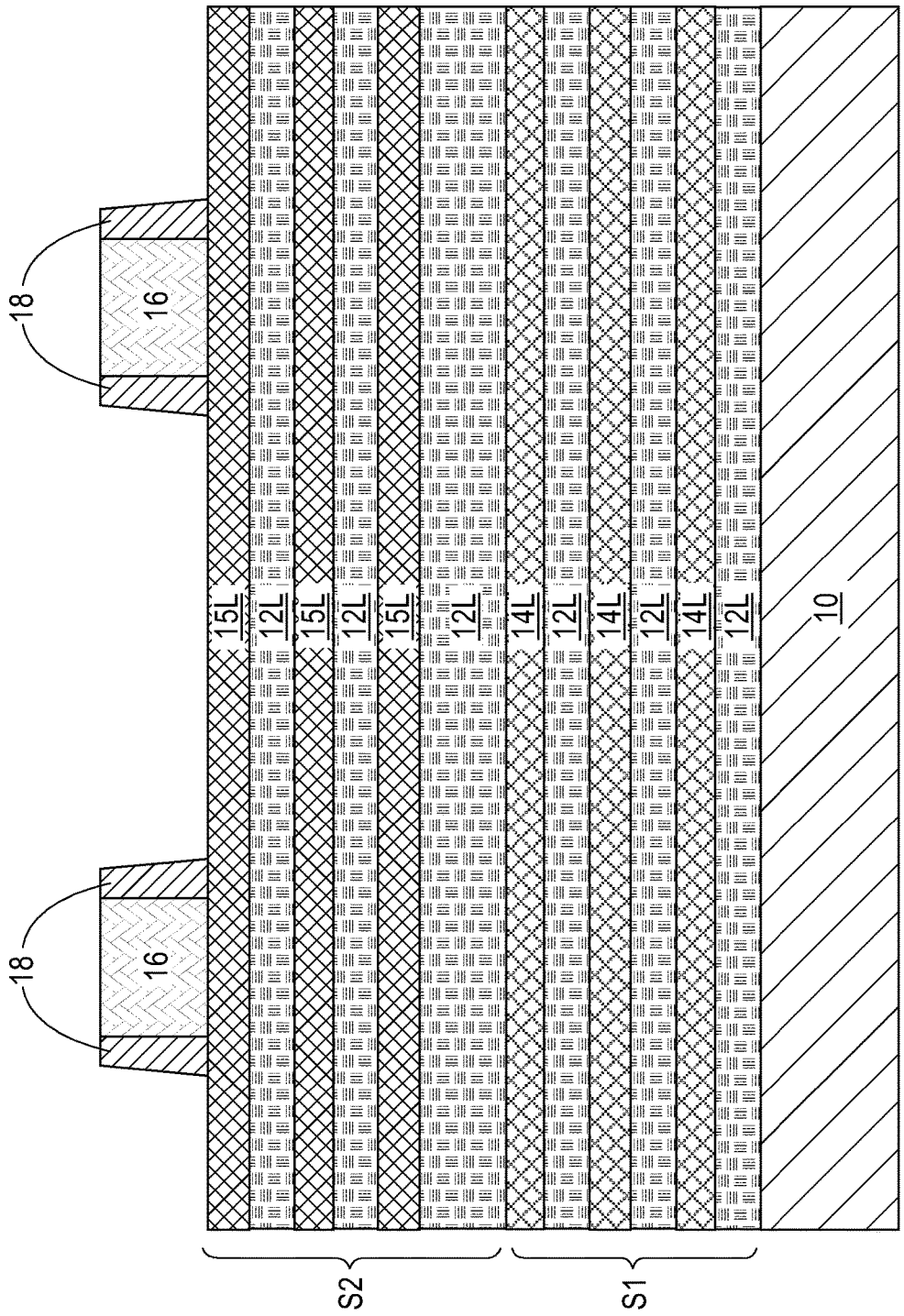
FIG. 2 is a cross sectional view of the exemplary semiconductor structure of FIG. 1 after forming at least one sacrificial gate structure and a dielectric spacer.

Referring now to FIG. 2, there is illustrated the exemplary semiconductor structure of FIG. 1 after forming at least one sacrificial gate structure 16 and a dielectric spacer 18. By way of illustration, two sacrificial gate structures 16 are exemplified in the drawings of the present application. Although not shown, each sacrificial gate structure 16 is located on a first side and a second side of the first and second semiconductor material stacks (S1, S2) and spans across a topmost surface of a portion of the second semiconductor material stack, S2. Each sacrificial gate stack 16 thus straddles over a portion of the first and second semiconductor material stacks (S1, S2). The dielectric spacer layer 18 is present on sidewalls of each sacrificial gate structure 16; the dielectric spacer 18 also straddles over the first and second semiconductor material stacks (S1, S2).

It is noted that in the drawings of the present application, the sacrificial gate structures 16 and dielectric spacer 18 are only shown as being present atop, not along sidewalls, of the first and second semiconductor material stacks (S1, S2). This was done for clarity and to illustrate the nanosheet stacks that are formed beneath the sacrificial gate structures 16 and the dielectric spacer 18.

Each sacrificial gate structure 16 may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the at least one sacrificial gate structure 16. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure 16, the dielectric spacer 18 can be formed. The dielectric spacer 18 can be formed by first providing a dielectric spacer material and then etching the dielectric spacer material. One example of a dielectric spacer material that may be employed in the present application is silicon nitride or silicon dioxide.

The dielectric spacer material that provides the dielectric spacer 18 may be provided by a deposition process including, for example, chemical vapor deposition (CVD), plasma enhanced chemical vapor deposition (PECVD), or physical vapor deposition (PVD). The etch used to provide the dielectric spacer 18 may comprise a dry etching process such as, for example, reactive ion etching.

Figure 3:
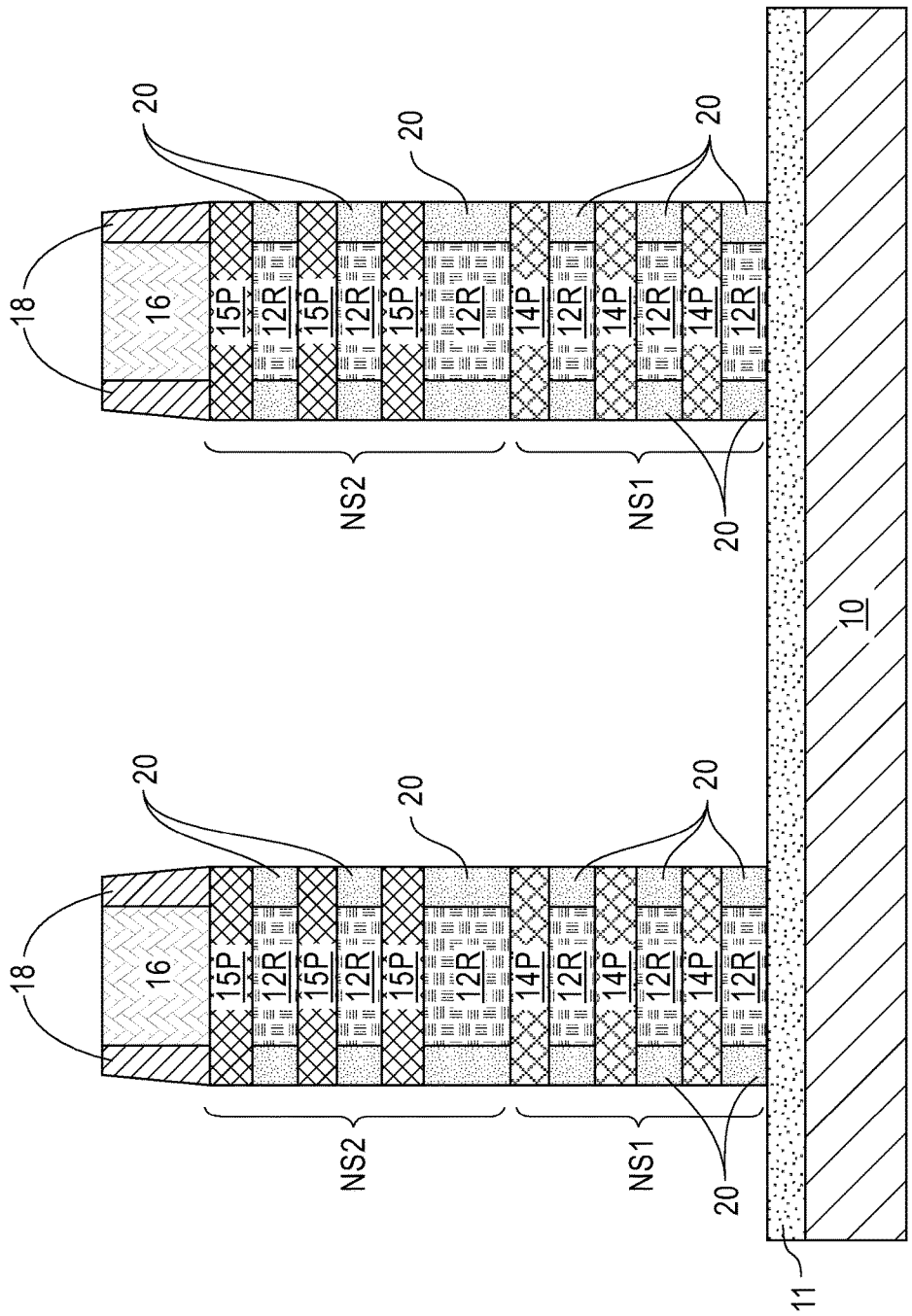
FIG. 3 is a cross sectional view of the exemplary semiconductor structure of FIG. 2 after forming a first nanosheet stack of alternating nanosheets of a sacrificial SiGe nanosheet having the first germanium content and a precursor SiGe channel material nanosheet having the second germanium content, and a second nanosheet stack of alternating nanosheets of a sacrificial SiGe nanosheet having the first germanium content and a Si channel material nanosheet under the least one sacrificial gate structure and the dielectric spacer by removing physically exposed portions of the first and second semiconductor material stacks that are not protected by the least one sacrificial gate structure and the dielectric spacer, recessing each sacrificial SiGe nanosheet, forming an inner spacer within a gap formed by the recessing of each sacrificial SiGe nanosheet, and forming a dielectric isolation layer.

Referring now FIG. 3, there is illustrated the exemplary semiconductor structure of FIG. 2 after forming a first nanosheet stack, NS1, of alternating nanosheets of a sacrificial SiGe nanosheet having the first germanium content and a precursor SiGe channel material nanosheet 14P having the second germanium content, and a second nanosheet stack, NS2, of alternating nanosheets of a sacrificial SiGe nanosheet having the first germanium content and a Si channel material nanosheet 15P under the least one sacrificial gate structure 16 and the dielectric spacer 18, recessing each sacrificial SiGe nanosheet to provide a recessed sacrificial SiGe nanosheet 12R, forming an inner spacer 20 in each gap formed by the recessing of the sacrificial SiGe nanosheets, and forming dielectric isolation layer 11.

The first and second nanosheet stacks (NS1, NS2) can be formed by removing physically exposed portions of the first and second semiconductor material stacks (S1, S2) that are not protected by the least one sacrificial gate structure 16 and the dielectric spacer 18. The removal of the portions of the first and second semiconductor material stacks (S1, S2) not covered by the least one sacrificial gate structure 16 and the dielectric spacer 18 can be performed utilizing an anisotropic etching process such as, for example, reactive ion etching (RIE). Portions of the first and second semiconductor material stacks (S1, S2) remain beneath the least one sacrificial gate structure 16 and the dielectric spacer 18. The remaining portion of the first semiconductor material stack, S1, which is present beneath the least one sacrificial gate structure 16 and the dielectric spacer material layer 18, is referred to as a first nanosheet stack, NS1. The remaining portion of the second semiconductor material stack, S2, that is present beneath the least one sacrificial gate structure 16 and the dielectric spacer material layer 18 and atop the first nanosheet stack, NS1, is referred to as a second nanosheet stack, NS2.

The first nanosheet stack, NS1, includes alternating nanosheets of remaining portions of each sacrificial SiGe layer (referred to herein as sacrificial SiGe nanosheets) and remaining portions of each precursor SiGe channel material layer (referred to herein as precursor SiGe channel material nanosheets 14P); the sacrificial SiGe nanosheets are not specifically labeled since they will be subsequently recessed to provide recessed sacrificial SiGe nanosheets 12R. The second nanosheet stack, NS2, includes alternating nanosheets of remaining portions of each sacrificial SiGe layer (referred to herein as sacrificial SiGe nanosheets) and remaining portions of each Si channel material layer (referred to herein as Si channel material nanosheets 15P); the sacrificial SiGe nanosheets are not specifically labeled since they be will subsequently recessed to provide recessed sacrificial SiGe nanosheets 12R.

Each nanosheet, i.e., sacrificial SiGe nanosheet, precursor SiGe channel material nanosheet 14P and Si channel material nanosheet 15P, has a thickness as mentioned above for the individual sacrificial SiGe layers 12L, the precursor SiGe channel material layers 14L, and Si channel material layers 15L, and a width from 30 nm to 200 nm. At this point of the present application, the sidewalls of each sacrificial SiGe nanosheet are vertically aligned to sidewalls of each precursor SiGe channel material nanosheet 14P, and each Si channel material nanosheet 15P, and the vertically aligned sidewalls of the first and second nanosheet stacks (NS1, NS2) are vertically aligned to an outermost sidewall of the dielectric spacer 18.

Next, and as also shown in FIG. 3, each sacrificial SiGe nanosheet within the first and second nanosheet stacks (NS1, NS2) is recessed to provide a recessed sacrificial SiGe nanosheet 12R. Each recessed sacrificial SiGe nanosheet 12R has a width that is less than the original width of each sacrificial SiGe nanosheet. The recessing of each sacrificial SiGe nanosheet provides a gap (not specifically shown) between each neighboring pair of channel material nanosheets 14P or 15P within a given first and second nanosheet stacks (NS1, NS2). The recessing of each sacrificial SiGe nanosheet may be performed utilizing a lateral etching process that is selective in removing physically exposed end portions of each sacrificial SiGe nanosheet relative to the precursor SiGe channel material nanosheets 14p and Si channel material nanosheets 14P.

An inner spacer 20, as shown in FIG. 3, is formed into each gap created by the recessing of each sacrificial SiGe nanosheet. The inner spacer 20 may be formed by deposition of a dielectric spacer material and etching such as, for example, RIE. The dielectric spacer material that provides the inner spacer 20 may be the same as, or different from, the dielectric spacer material that provides dielectric spacer 18. The inner spacers 20 have an inner sidewall that directly contacts a sidewall of one of the recessed sacrificial SiGe nanosheet 12R, and an outer sidewall that is vertically aligned to an outer sidewall of one of the Si channel material nanosheets 14P.

Dielectric isolation layer 11 can then be formed. Dielectric isolation layer 11 may be formed by etching an upper portion of the semiconductor substrate 10 and thereafter depositing a dielectric material such as, for example, silicon dioxide. An etch back process may follow the deposition of the dielectric material that provides the dielectric isolation layer 11. Dielectric isolation layer 11 is present between the first nanosheet stack, NS1, and a remaining portion of the semiconductor substrate 10. During the etching of the upper portion of the semiconductor substrate 10, the first and second nanosheet stacks (NS1, NS2) are anchored by the sacrificial gate structure 16 and the dielectric spacer 18.

Figure 4:
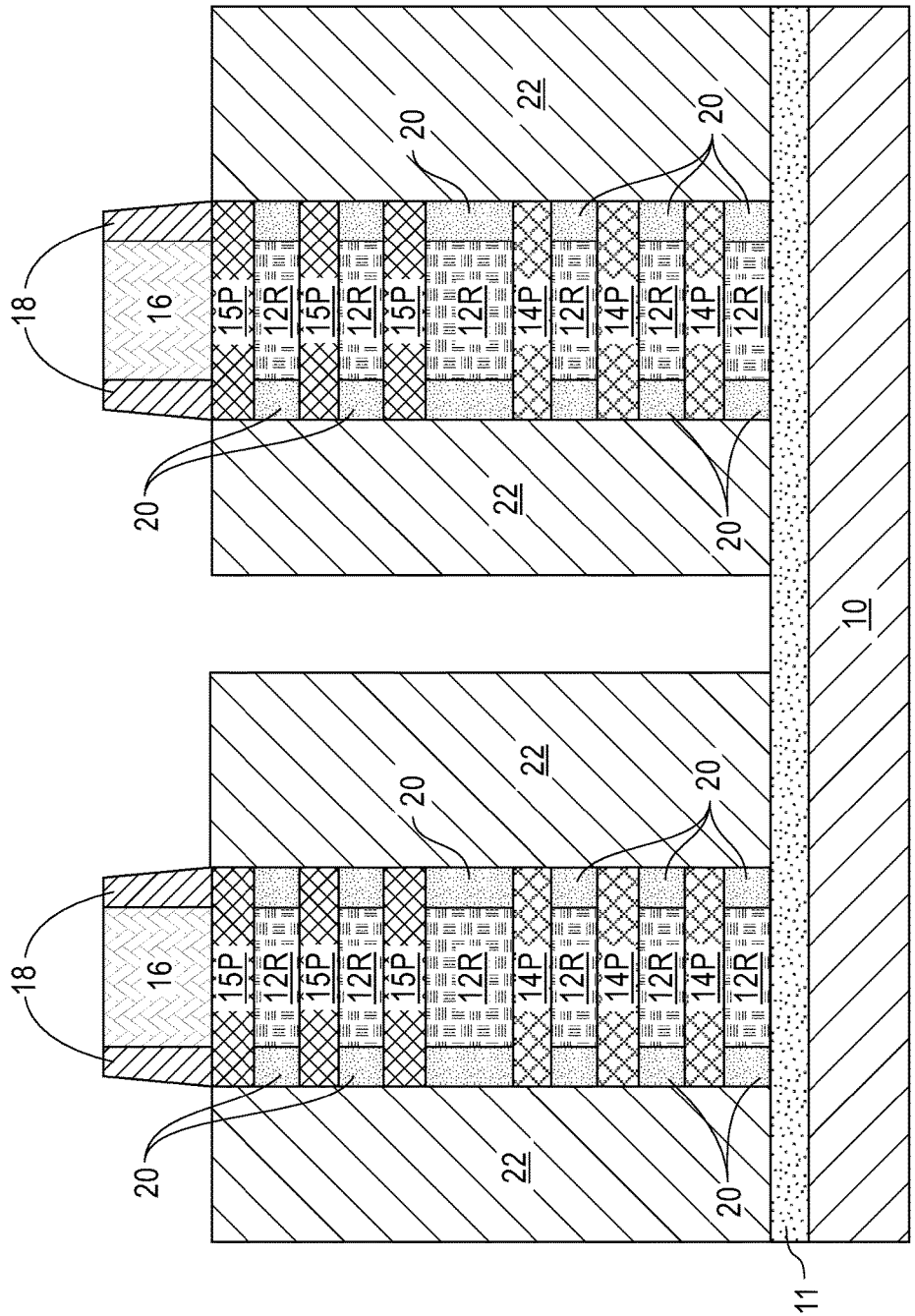
FIG. 4 is a cross sectional view of the exemplary semiconductor structure of FIG. 3 after forming a pFET S/D semiconductor material by epitaxial growth on physically exposed sidewalls of each Si channel material nanosheet and each precursor SiGe channel material nanosheet.

Referring now to FIG. 4, there is illustrated the exemplary semiconductor structure of FIG. 3 after forming a pFET S/D semiconductor material 22 by epitaxial growth on physically exposed sidewalls of each Si channel material nanosheet 15P and each precursor SiGe channel material nanosheet 14P. In the present application, the pFET S/D semiconductor material 22 grows laterally out from the sidewalls of each channel material nanosheet 14P and 15P. No bottom up growth is observed due to the presence of the dielectric isolation structure 11.

The pFET S/D semiconductor material 22 is formed on each side of the first and second nanosheet stacks (NS1, NS2). The pFET S/D semiconductor material 22 includes a semiconductor material and a p-type dopant. The semiconductor material that provides the pFET S/D semiconductor material 22 typically comprises a same semiconductor material as that which provides each Si channel material nanosheet 14P. For example, the semiconductor material that provides pFET S/D semiconductor material 22 may comprise a silicon germanium alloy which may have a higher germanium content than the recessed sacrificial SiGe nanosheets 12R.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. In one embodiment, the p-type dopant that can be present in the pFET S/D semiconductor material 22 can be introduced into the precursor gas that provides the pFET S/D semiconductor material 22. In another embodiment, the dopant can be introduced into an intrinsic semiconductor layer by utilizing one of ion implantation or gas phase doping. In one example, the pFET S/D semiconductor material 22 includes silicon germanium that is doped with boron (i.e., B doped SiGe). As mentioned above, pFET S/D semiconductor material 22 is formed by an epitaxial growth (or deposition) process, as is defined above.

Figure 5:
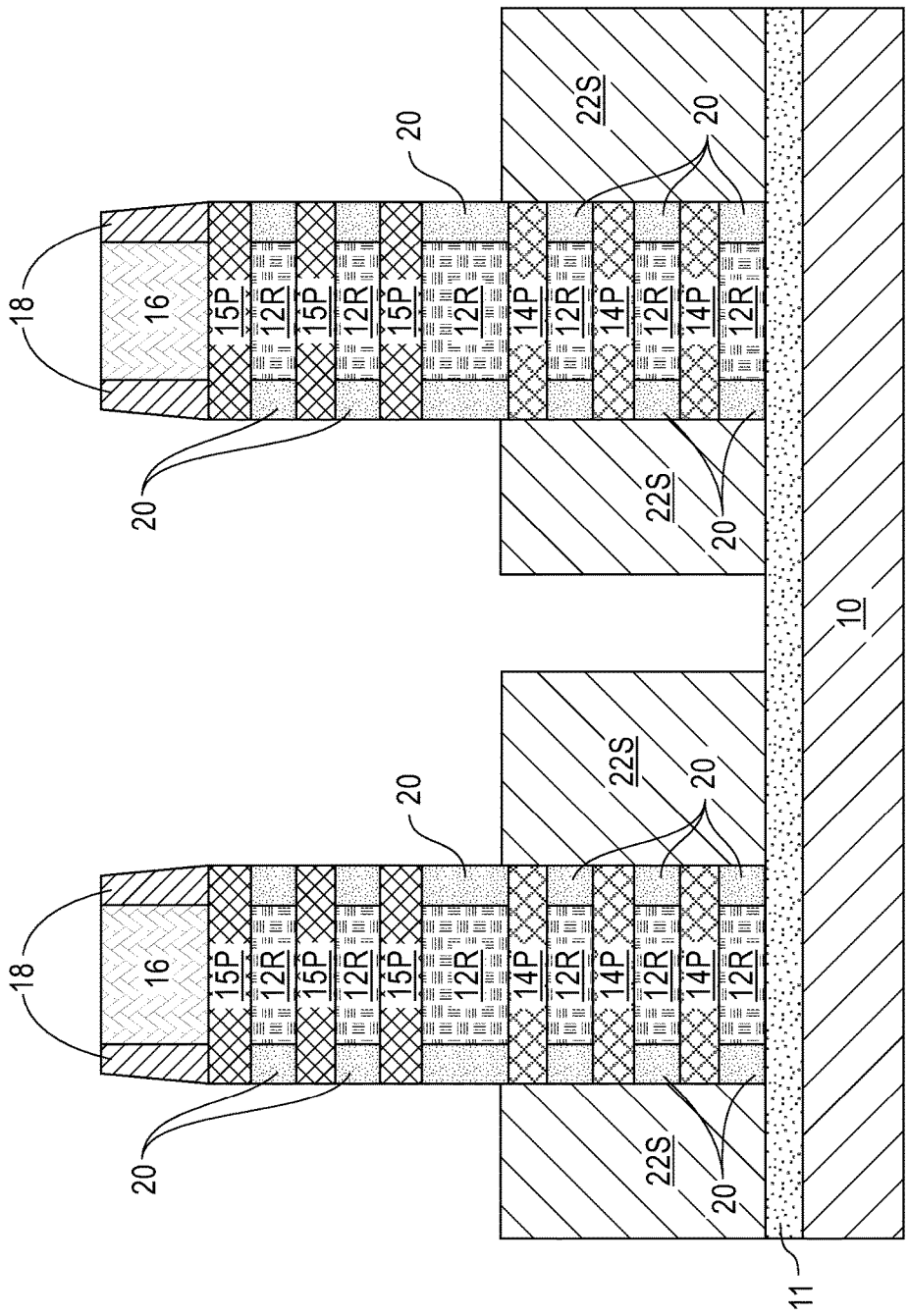
FIG. 5 is a cross sectional view of the exemplary semiconductor structure of FIG. 4 after removing the pFET S/D semiconductor material from the sidewalls of each Si channel material nanosheet in the second nanosheet stack, while maintaining pFET S/D semiconductor material on the physically exposed sidewalls of each precursor SiGe channel material nanosheet of the first nanosheet stack.

Referring now to FIG. 5, there is illustrated the exemplary semiconductor structure of FIG. 4 after removing the pFET S/D semiconductor material 22 from the sidewalls of each Si channel material nanosheet 15P in the second nanosheet stack, NS2, while maintaining pFET S/D semiconductor material 22 on the physically exposed sidewalls of each precursor SiGe channel material nanosheet 14P of the first nanosheet stack, NS1. The remaining portion of the pFET S/D semiconductor material 22 can be referred to herein as a pFET S/D region 22S.

The removal of the pFET S/D semiconductor material 22 from the sidewalls of each Si channel material nanosheet 15P in the second nanosheet stack, NS2, can be performed utilizing a recess etching process that is selective for removing pFET S/D semiconductor material 22. The height of each pFET S/D region 22S is above a topmost surface of the topmost precursor SiGe channel material nanosheet 14P of the first nanosheet stack, NS1, and beneath a topmost surface of the bottommost recessed sacrificial SiGe nanosheet 12R in the second nanosheet stack, NS2.

Figure 6:
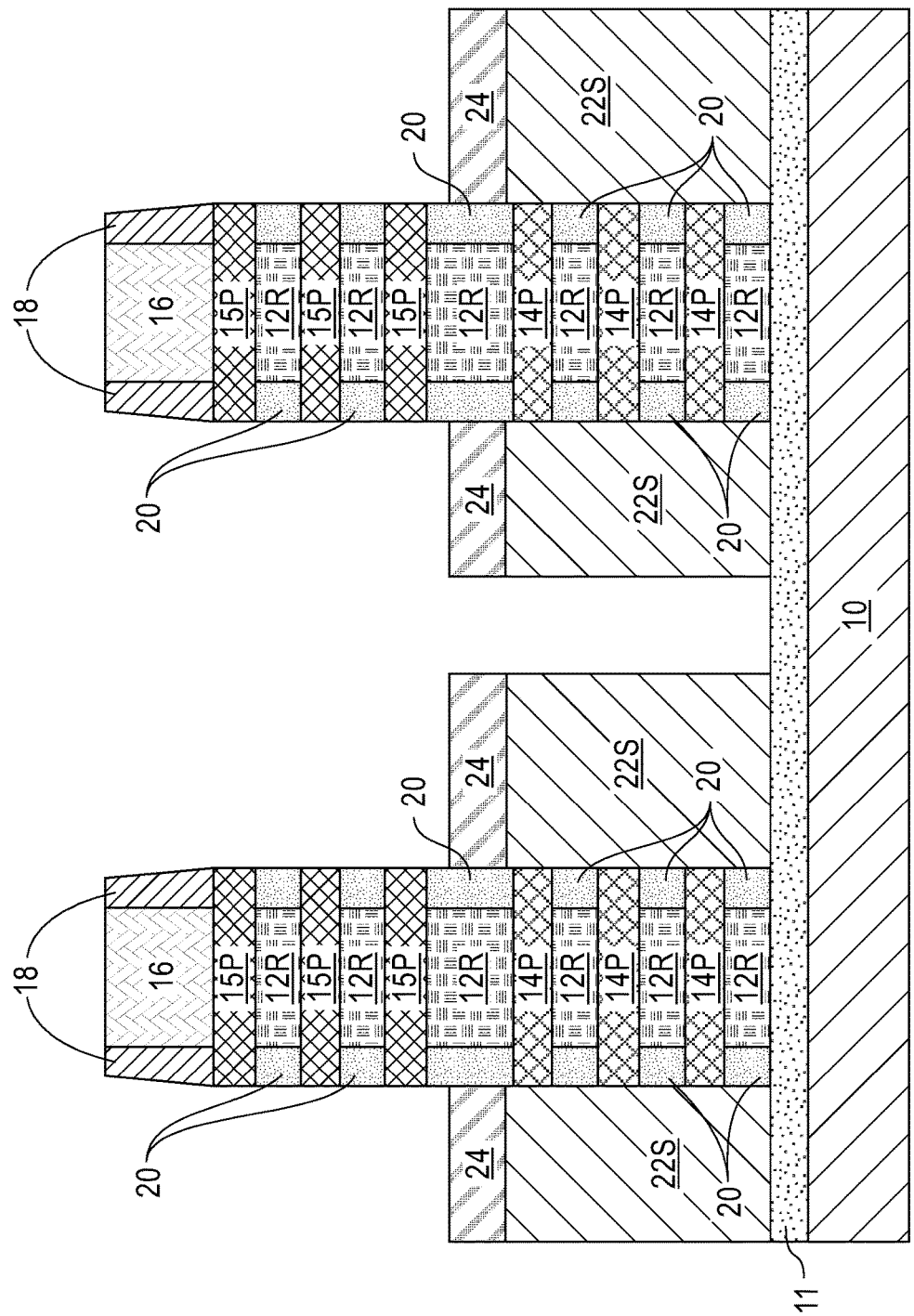
FIG. 6 is a cross sectional view of the exemplary semiconductor structure of FIG. 5 after forming a dielectric material on a physically exposed topmost surface of the maintained pFET S/D semiconductor material.

Referring now to FIG. 6, there is illustrated the exemplary semiconductor structure of FIG. 5 after forming a dielectric material 24 on a physically exposed topmost surface of the maintained pFET S/D semiconductor material 22 (i.e., the pFET S/D region 22S). The dielectric material 24 may be the same as, or different from, the dielectric material that provides the dielectric isolation layer 11. In one example, the dielectric material 24 is composed of silicon dioxide. The dielectric material 24 may be formed by a deposition process such as, for example, CVD, PECVD, ALD or PVD. The dielectric material 24 has a thickness that is typically from 5 nm to 50 nm. Other thicknesses are also contemplated for the dielectric material 24 and are thus not excluded from being used.

Figure 7:
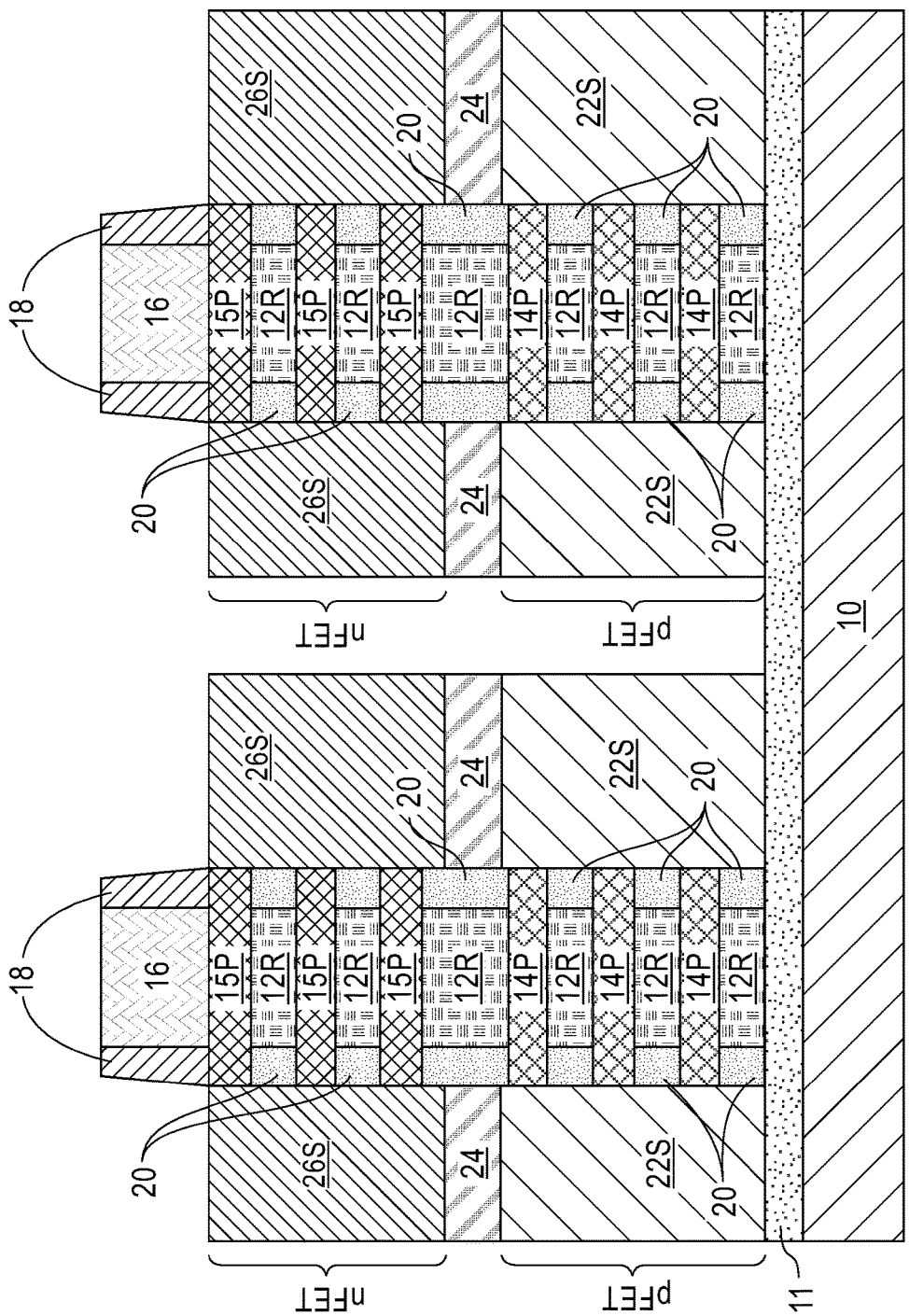
FIG. 7 is a cross sectional view of the exemplary semiconductor structure of FIG. 6 after forming an nFET S/D region by epitaxial growth of a semiconductor material on physically exposed sidewalls of each Si channel material nanosheet of the second nanosheet stack and atop the dielectric material.

Referring now to FIG. 7, there is illustrated the exemplary semiconductor structure of FIG. 6 after forming an nFET S/D region 26S by epitaxial growth of a semiconductor material on physically exposed sidewalls of each Si channel material nanosheet 15P of the second nanosheet stack, NS2, and atop the dielectric material 24. The nFET S/D region 26S is formed on each side of the second nanosheet stack, NS2.

Each nFET S/D region 26S includes a semiconductor material and an n-type dopant. The semiconductor material that provides each nFET S/D region 26S typically comprises a same semiconductor material as that which provides each Si channel material nanosheet 15P. In other embodiments of the present application, the semiconductor material that provides each nFET S/D region 26S may comprise a different semiconductor material than that which provides each Si channel material nanosheet 15P.

The term "n-type dopant" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each nFET S/D region 26S can be introduced into the precursor gas that provides each nFET S/D region 26S. In another embodiment, the dopant can be introduced into an intrinsic semiconductor layer by utilizing one of ion implantation or gas phase doping. In one example, each nFET S/D region 26S comprises silicon that is doped with phosphorus (i.e., P doped Si). As mentioned above, each nFET S/D region 26S is formed by an epitaxial growth (or deposition) process, as is defined above.

The height of the nFET S/D regions 26S may be above, coplanar with, or beneath a topmost surface of the topmost Si channel material nanosheet 15P of the second nanosheet stack, NS2, but not lower than the bottommost surface of the topmost Si channel material nanosheet 15P of the second nanosheet stack, NS2.

Figure 8:
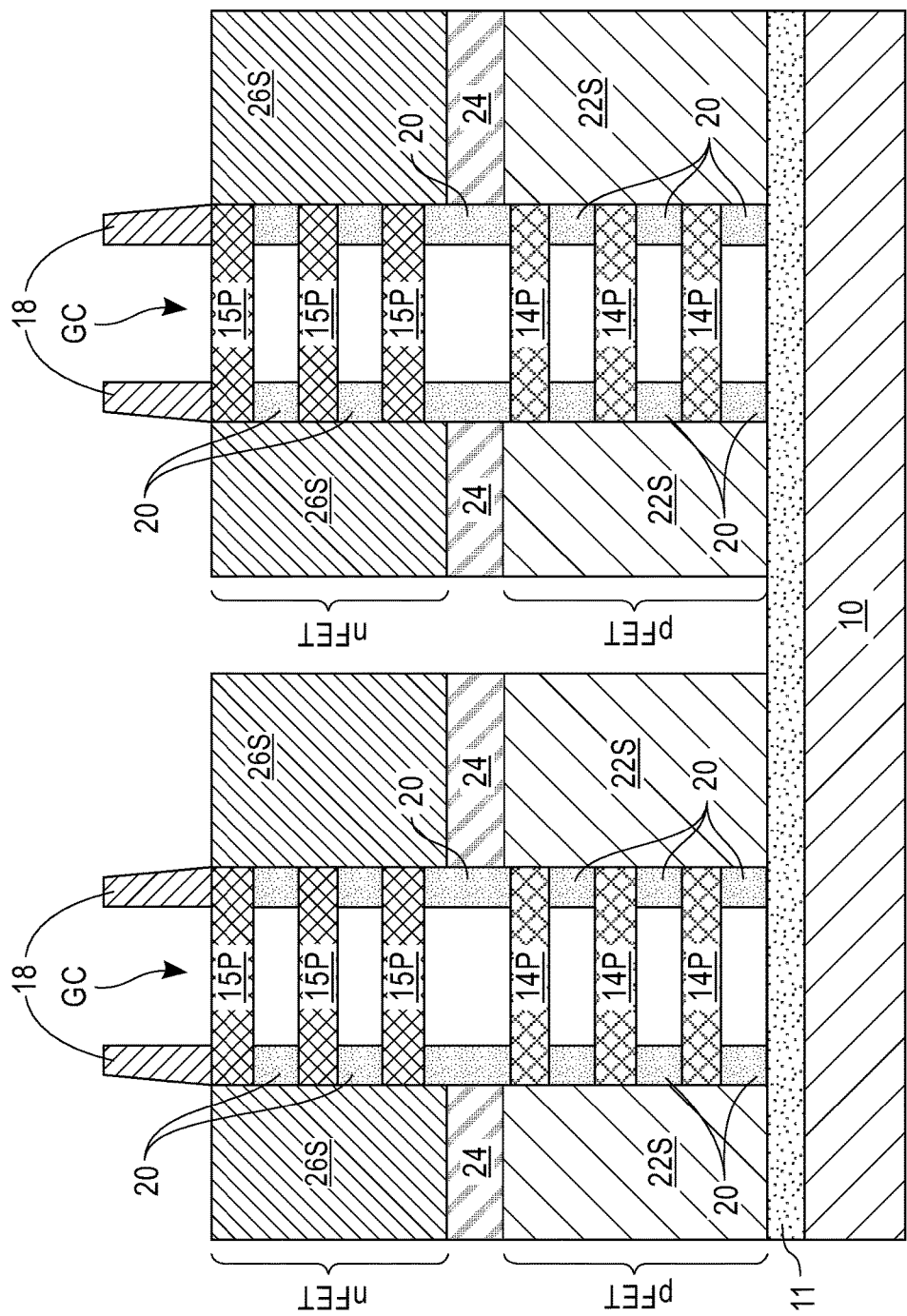
FIG. 8 is a cross sectional view of the exemplary semiconductor structure of FIG. 7 after removing each sacrificial gate structure and each sacrificial SiGe nanosheet.

Referring now to FIG. 8, there is illustrated the exemplary semiconductor structure of FIG. 7 after removing each sacrificial gate structure 16 and each recessed sacrificial SiGe nanosheet 12R. The sacrificial gate structure 16 can be removed utilizing one or more anisotropic etching processes that are selective in removing the materials that provide the sacrificial gate structure 16. Next, each Si channel material nanosheet 15P and each precursor SiGe channel material nanosheet 14P is suspended by selectively etching each recessed sacrificial SiGe nanosheet 12R relative to the channel material nanosheet 14P and 15P. A gate cavity, GC, is formed by removing the sacrificial gate structure 16 and each recessed sacrificial SiGe nanosheet 12R. The gate cavity, GC, is present above, beneath and around each suspended Si channel material nanosheet 15P and each suspended precursor SiGe channel material nanosheet 14P. Vertically stacked and suspended Si channel material nanosheets 15P of the second nanosheet stack, NS2, are provided and define an nFET device region, while vertically stacked and suspended precursor SiGe channel material nanosheets 14P of the first nanosheet stack, NS1, are provided and are used to define a pFET device region.

Figure 9:
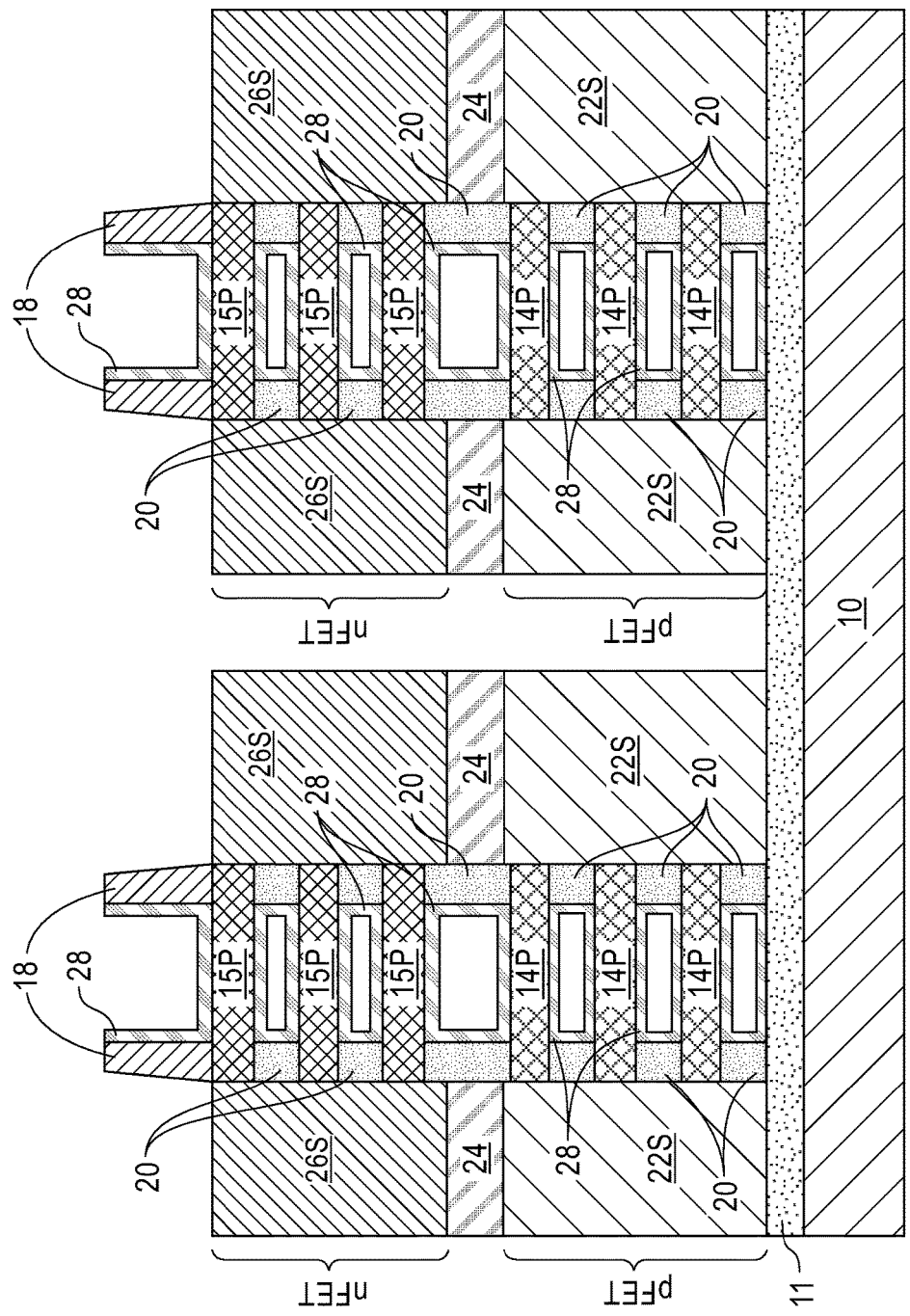
FIG. 9 is a cross sectional view of the exemplary semiconductor structure of FIG. 8 after forming a germanium oxide layer.

Referring now to FIG. 9, there is illustrated the exemplary semiconductor structure of FIG. 8 after forming a germanium oxide layer 28 in the gate cavity, GC. The germanium oxide layer 28 is formed on physically exposed surfaces of each Si channel material nanosheet 15P, and on physically exposed surfaces of each precursor SiGe channel material nanosheet 14P. The germanium oxide layer 28 is also present on inner sidewalls of the dielectric spacer 18 and the inner spacers 20. The germanium oxide layer 28 does not occupy the entire volume of the gate cavity, GC.

The germanium oxide layer 28 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, germanium oxide layer 28 can have a thickness in a range from 1 nm to 10 nm. Other thicknesses that are lesser than, or greater than, the aforementioned thickness range can also be employed for the germanium oxide layer 28.

Figure 10:
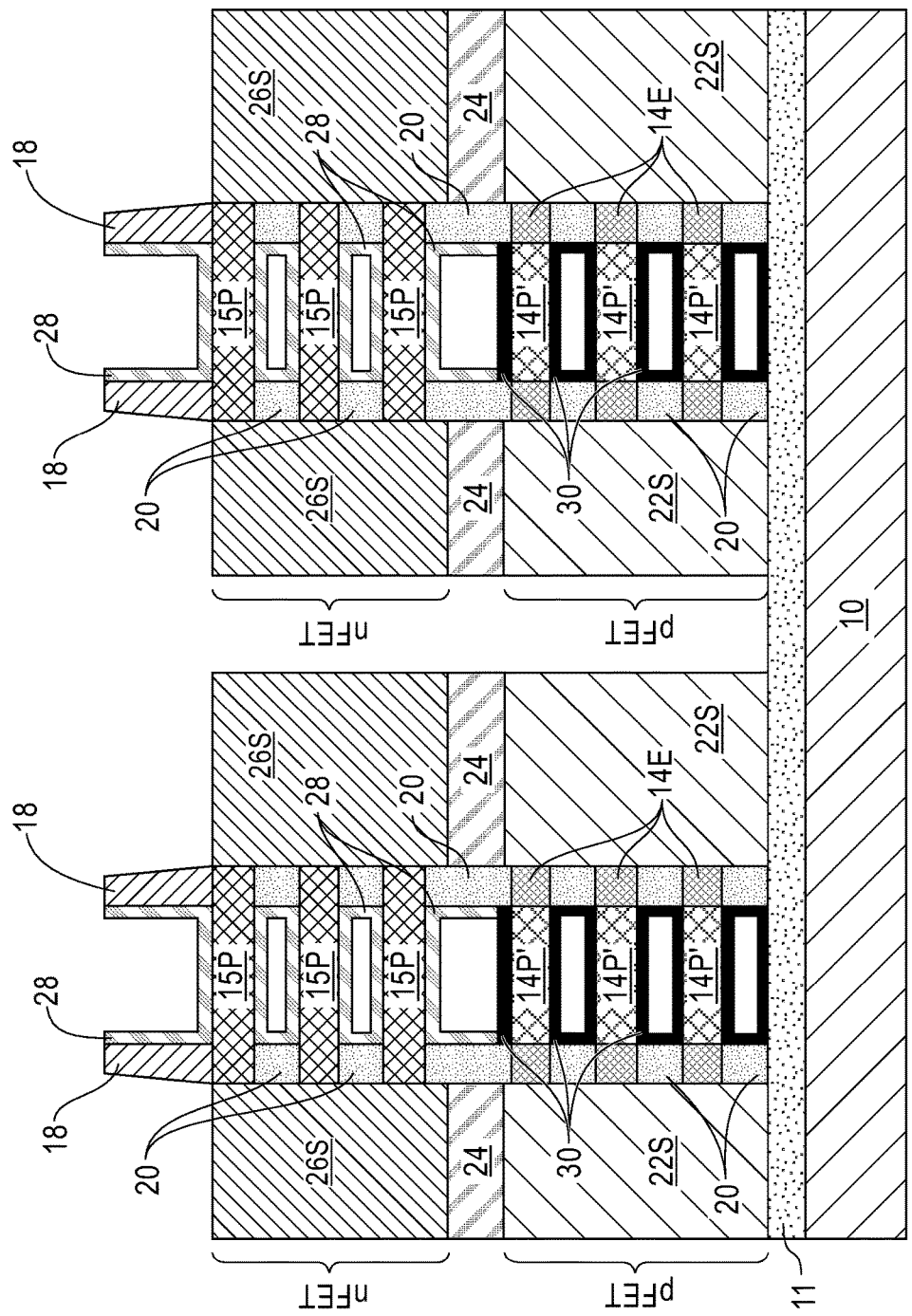
FIG. 10 is a cross sectional view of the exemplary semiconductor structure of FIG. 9 after performing a condensation anneal to convert a portion of each precursor SiGe channel material nanosheet that is in physical contact with the germanium oxide layer into a SiGe channel material nanosheet having a third germanium content that is greater than the second germanium content.

Referring now to FIG. 10, there is illustrated the exemplary semiconductor structure of FIG. 9 after performing a condensation anneal to convert a portion of each precursor SiGe channel material nanosheet 14P that is in physical contact with the germanium oxide layer 28 into a SiGe channel material nanosheet 14P' having a third germanium content that is greater than the second germanium content. In one example, the third germanium content can be from 20 atomic percent germanium to 50 atomic percent germanium. Portions of each precursor SiGe channel material nanosheet 14P that are not in physical contact with the germanium oxide layer 28 are not converted. The non-converted portions of each precursor SiGe channel material nanosheet 14P can be referred to as SiGe channel extension region 14E. As is illustrated, a SiGe channel extension region 14E is present at each end of a SiGe channel material nanosheet 14P'. Each SiGe channel extension 14E provides a path from the SiGe channel material nanosheet 14P' into a laterally adjacent pFET S/D region 22S.

In addition to converting a portion of each precursor SiGe channel material nanosheet 14P that is in physical contact with the germanium oxide layer 28 into a SiGe channel material nanosheet 14P', the condensation anneal also converts the germanium oxide layer 28 that is in physically contact with the precursor SiGe channel material nanosheet 14P into a silicon dioxide layer 30.

The condensation anneal is performed at low temperature (i.e., a temperature of less than 800° C., the lower temperature limit of the condensation anneal is about 350° C.) and in an inert ambient such as, for example, helium, argon, and/or nitrogen. In one example, the condensation anneal is a spike anneal that is performed at a temperature of about 700° C. in a nitrogen ambient.

Figure 11:
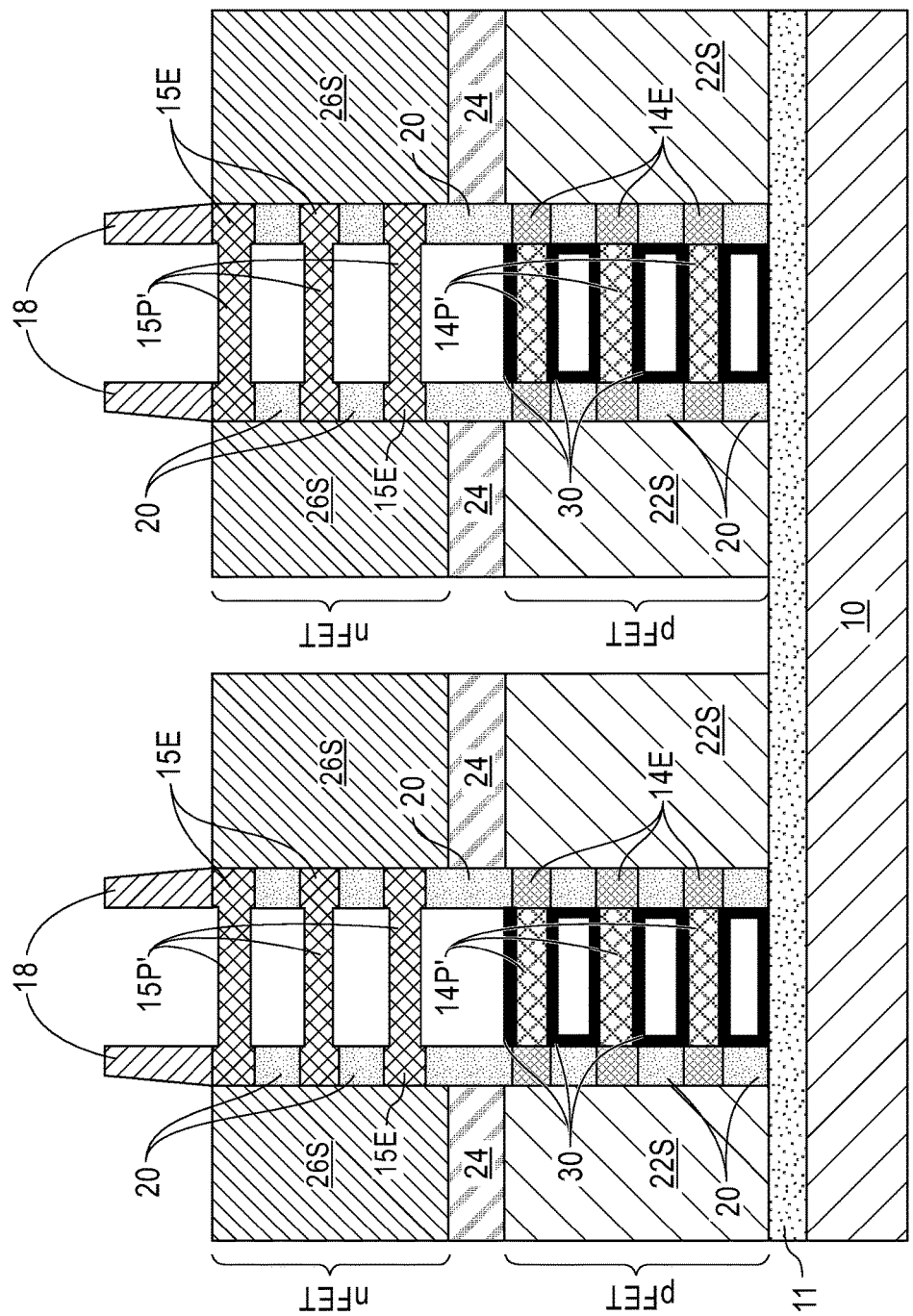
FIG. 11 is a cross sectional view of the exemplary semiconductor structure of FIG. 10 after removing unreacted germanium oxide layer.

Referring now to FIG. 11, there is illustrated the exemplary semiconductor structure of FIG. 10 after removing any unreacted germanium oxide layer 28. The unreacted germanium oxide layer 28 can be removed utilizing deionized water or any other etchant that can selectively remove germanium oxide.

Next, and as also shown in FIG. 11, the physically exposed portions of each Si channel material nanosheet 15 can be optionally thinned; no thinning of the SiGe channel material nanosheets 14P' occurs since the SiGe channel material nanosheets 14P' are protected by the silicon dioxide layer 30. Thinning of the physically exposed portions of each Si channel material nanosheet 15P provides a thinned Si channel material nanosheet 15P'. Portions of each Si channel material nanosheet 15 that are not physically exposed are not thinned. Each non-thinned portion of the Si channel material nanosheet may be referred to a Si channel extension region 15E. As is illustrated, a Si channel extension region 15E is present at each end of a thinned Si channel material nanosheet 15P'. Each Si channel extension 15E provides a path from the thinned Si channel material nanosheet 15P' into a laterally adjacent nFET S/D region 26S. Collectively, each thinned channel material nanosheet 15P' which has a Si channel extension 15E are each of its end is dumbbell (or dogbone) shaped. The thinning of the physically exposed portions of each Si channel material nanosheet 15P may be performed utilizing a series of oxidizing and etch steps or a chemical oxide removal (COR) process can be employed.

Figure 12:
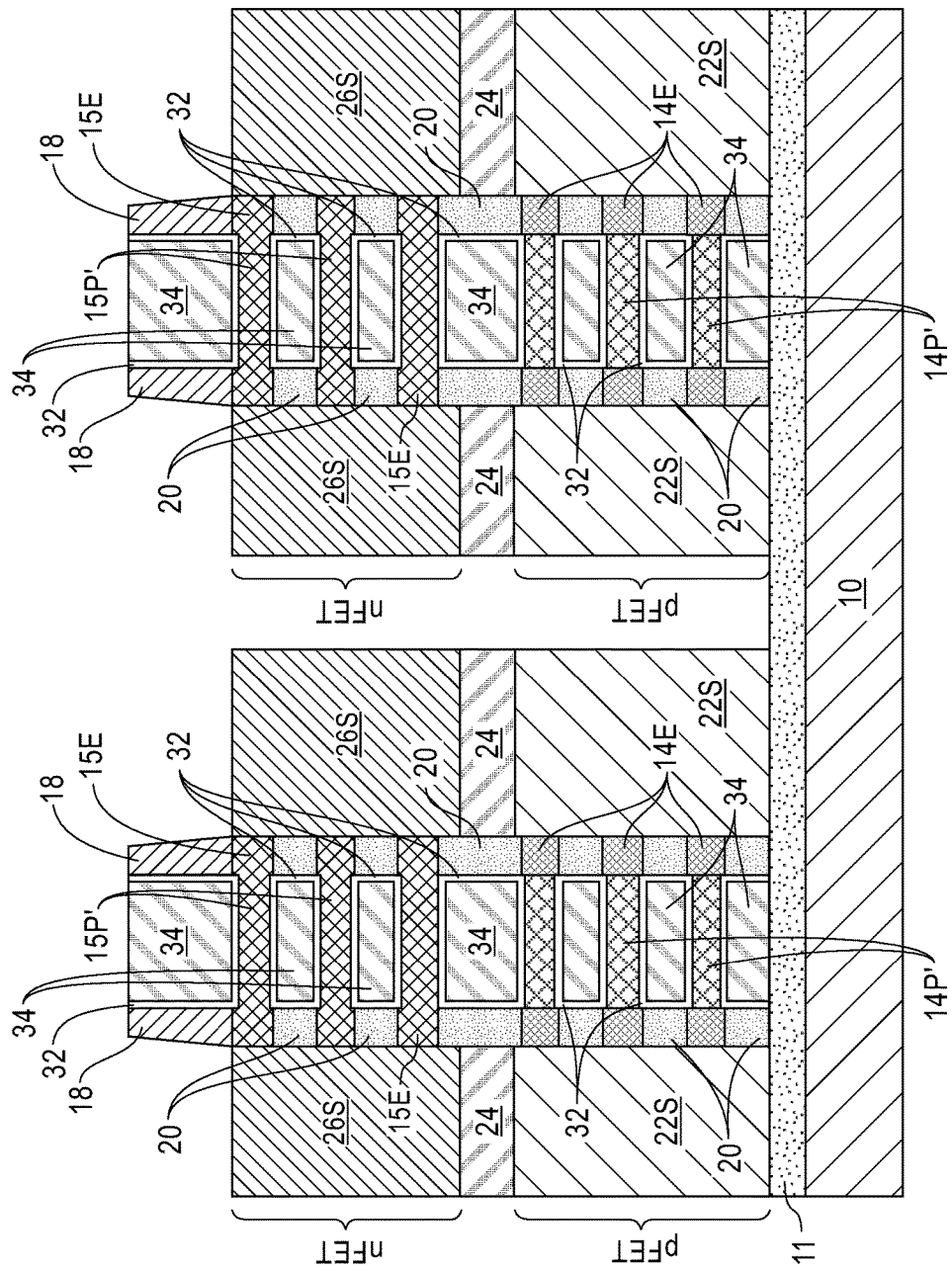
FIG. 12 is a cross sectional view of the exemplary semiconductor structure of FIG. 11 after removing silicon dioxide from each SiGe channel material nanosheet, and forming a gate dielectric material and a work function metal in the gate cavity.

Referring now to FIG. 12, there is illustrated the exemplary semiconductor structure of FIG. 11 after removing the silicon dioxide layer 30 from each SiGe channel material nanosheet 14P' and forming a gate dielectric material 32 and a work function metal 34 in the gate cavity, GC.

The removal of the silicon dioxide layer 30 from each SiGe channel material nanosheet 14P' can be performed utilizing an etching process that is selective for removing silicon dioxide. Next, the gate dielectric material 32 is formed. The gate dielectric material 32 is present on physically exposed surfaces of each thinned Si channel material nanosheet 15P' (or the physically exposed surfaces of each non-thinned Si channel material nanosheet 15P), as well as on physically exposed surface of each SiGe channel material nanosheet 14P'. The gate dielectric material 32 is also present on inner sidewalls of the dielectric spacer 18 and the inner spacers 20. The gate dielectric material 32 does not occupy the entire volume of the gate cavity, GC.

The gate dielectric material 32 can be an oxide, nitride, and/or oxynitride. In one example, the gate dielectric material 32 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as the gate dielectric 32.

The gate dielectric material 32 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material 32 can have a thickness in a range from 1 nm to 10 nm. Other thicknesses that are lesser than, or greater than, the aforementioned thickness range can also be employed for the gate dielectric material 32.

Next, a work function metal 34 (i.e., a single work function metal) is formed on the gate dielectric material 32 in both the nFET device region and the pFET device region. In one embodiment, the work function metal 34 is an n-type work function metal. Illustrative n-type work function metals that may be employed include hafnium, zirconium, titanium, tantalum, aluminum, metal carbides (e.g., hafnium carbide, zirconium carbide, titanium carbide, and aluminum carbide), aluminides, or any combination thereof. In one embodiment, the n-type work function metal that may be employed includes a material stack of TiN/Al-containing alloy/TiN.

In another embodiment, the work function metal 34 is a p-type work function metal. Illustrative p-type work function metals that may be employed include ruthenium, palladium, platinum, cobalt, nickel, and conductive metal oxides, or any combination thereof.

The work function metal 34 can be formed utilizing a deposition process such as, for example, CVD, PECVD or ALD.

In FIG. 12, nFET devices are shown vertically stacked above pFET devices. Each pFET device includes a first functional gate structure present on physically exposed surfaces, and between, each SiGe channel material nanosheet 14P' of a vertical stack of suspended SiGe channel material nanosheets. By "functional gate structure" it is meant a permanent gate structure used to control output current (i.e., flow of carriers in the channel) of a semiconducting device through electrical or magnetic fields. The first functional gate structure includes gate dielectric material 32 and work function metal 34. pFET S/D regions 22S are present on physically exposed sidewalls of a SiGe channel extension region 14E that is located at the ends of each SiGe channel material nanosheet 14P'.

Each nFET device includes a second functional gate structure present on physically exposed surfaces, and between, each Si channel material nanosheet (15P or 15P') of a vertical stack of suspended Si channel material nanosheets. The second functional gate structure includes gate dielectric material 32 and work function metal 34. nFET S/D regions 26S are present on physically exposed sidewalls of a Si channel extension region 14E that is located the end of each Si channel material nanosheet (15P or 15P"). A dielectric material 24 electrically isolates the pFET S/D regions 22S from the nFET S/D regions 26S.

Figure 13:
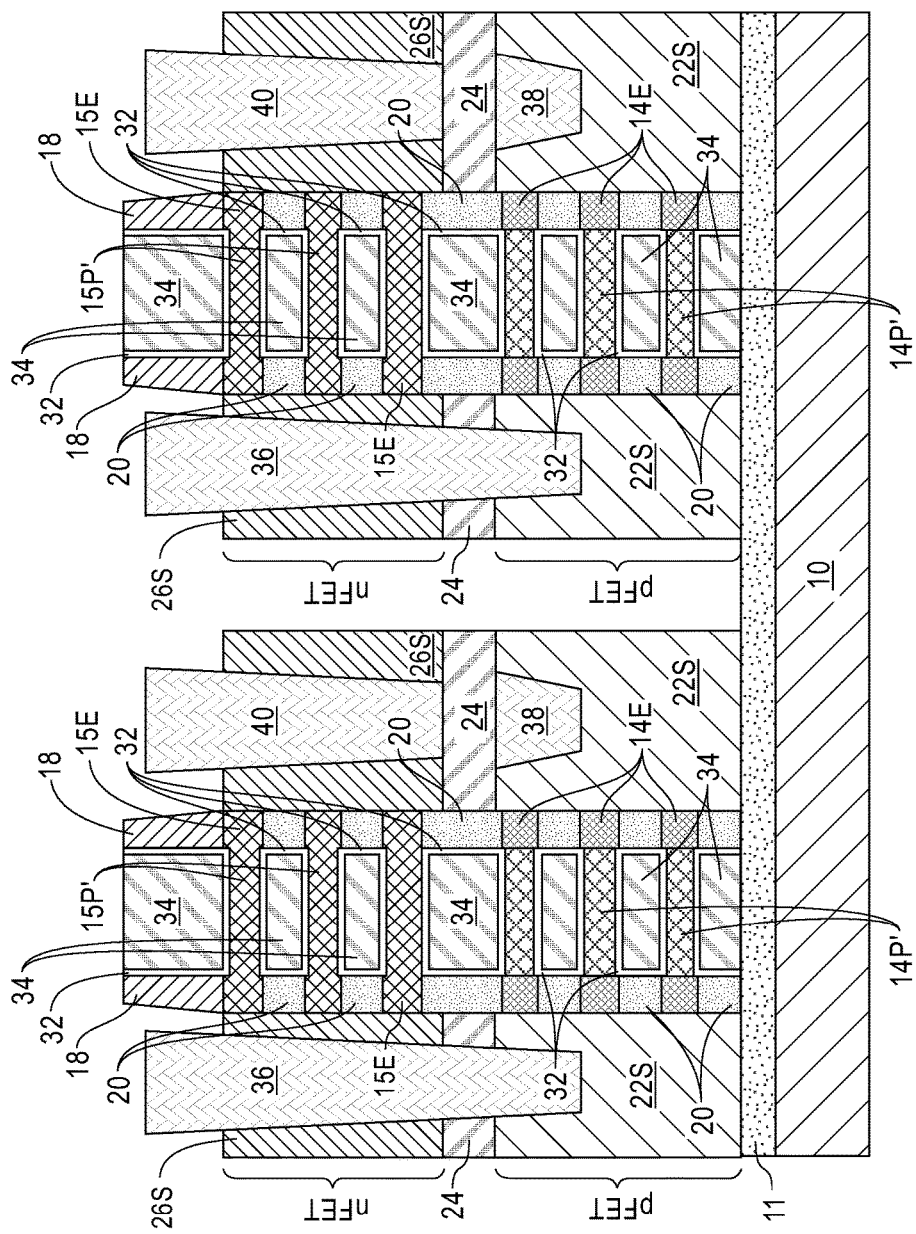
FIG. 13 is a cross sectional view of the exemplary semiconductor structure of FIG. 12 after forming S/D contact structures.

Referring now to FIG. 13, there is illustrated the exemplary semiconductor structure of FIG. 12 after forming S/D contact structures (36, 38 and 40).

Contact structures 36, 38 and 40 are formed by first forming first S/D contact structures 36 in contact openings that are formed through the nFET S/D regions 26S, the dielectric material 24 and a portion of the maintained pFET S/D semiconductor material (i.e., the pFET S/D regions 22S). A first contact structure 36 is formed on each side of vertical stack of suspended SiGe and Si channel material nanosheets.

The contact openings can be formed by lithography and etching. The first S/D contact structures 36 can include a contact metal (such as, for example, W, Al or Cu) or metal alloy (such as, for example Cu—Al). The first S/D contact structures 36 can be formed by depositing a contact metal or metal alloy.

Next, the first S/D contact structure 36 is removed from an upper portion of a first contact opening that is located on one side of the vertical stack of suspended SiGe and Si channel material nanosheets such that the upper portion of the first contact opening in the nFET device region is not filled at this point within any contact metal or metal alloy. A portion of the first S/D contact structure 36 remains in a bottom portion of the physically exposed first contact opening. The remaining portion of the first S/D contact structure 36 may be referred to herein as a pFET S/D contact structure 38.

This step of the present application may be performed by first providing a block mask over portions of the exemplary structure not including a first S/D contact structure 36 to further process. An etch is then performed to remove the first S/D contact structure 36 from an upper portion of each physically exposed first contact opening. In some embodiments, this step may be omitted.

Next, additional dielectric material is formed in the physically exposed first contact opening. The additional dielectric material is compositionally the same as the dielectric material that provides dielectric material 24. The additional dielectric material may be formed utilizing one of the deposition techniques mentioned above for forming dielectric material 24. A recess etch may or may not follow the deposition of the additional dielectric material. The additional dielectric material may have a bottommost surface that is coplanar or located beneath a bottommost surface of dielectric material and/or the additional dielectric material may have a topmost surface that is coplanar, located beneath, or located above a topmost surface of the original dielectric material 24.

S/D contact structure 40 is then formed in the physically exposed first contact opening and on the additional dielectric material. The S/D contact structure 40 may include one of the contact metals or metal alloys mentioned above for first S/D contact structure 36. The contact metal or metal alloy that provides the second S/D contact structure 38 may be the same as, or different from, the contact metal or metal alloy that provides the first S/D contact structure 36. The S/D contact structure 40 can be formed by deposition. The S/D contact structure 40 may be referred to herein an nFET S/D contact structure.

In the illustrated embodiment, the nFET S/D region 26S and the pFET S/D region 22S shown to the left of each vertical stack of suspended SiGe and Si channel material nanosheets share a common S/D contact structure, i.e., first contact structure 36. To the right of each vertical stack of vertical stack of suspended SiGe and Si channel material nanosheets, the nFET S/D region 26S has its' own contact structure, i.e., nFET S/D contact structure 38, while the pFET S/D region has its' own contact structure, i.e., pFET S/D contact structure 36P.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a pFET device comprising a first functional gate structure present on physically exposed surfaces, and between, each SiGe channel material nanosheet of a vertical stack of suspended SiGe channel material nanosheets;
   an nFET device stacked vertically above the pFET device and comprising a second functional gate structure present on physically exposed surfaces, and between, each Si channel material nanosheet of a vertical stack of suspended Si channel material nanosheets, wherein the first and second functional gate structures comprise a same work function metal;
   a Si channel material extension region located at each end of each Si channel material nanosheet: and
   a SiGe channel material extension region located at each end of each SiGe channel material nanosheet, wherein each Si channel material extension region has a thickness that is greater than a thickness of each Si channel material nanosheet, and each SiGe channel material extension region has a germanium content that is less than a germanium content of each SiGe channel material nanosheet.

2. The semiconductor structure of claim 1, further comprising pFET S/D regions present on physically exposed sidewalls of each SiGe channel material extension region, and nFET S/D regions present on physically exposed sidewalls of each Si channel material extension region.

3. The semiconductor structure of claim 2, further comprising a dielectric material located between each pFET S/D region and each nFET S/D region.

4. The semiconductor structure of claim 2, further comprising a shared S/D contact structure located on a first side of the vertically stacked nFET and pFET devices, wherein the shared S/D contact structure passes through one of the nFET S/D regions and into one of the pFET S/D regions.

5. The semiconductor structure of claim 4, further comprising an nFET S/D contact structure and a pFET S/D contact structure located on a second side of the vertically stacked nFET and pFET devices, opposite the first side, wherein the nFET S/D contact structure is present in another of the nFET S/D regions and the pFET contact structure is present in another of the pFET S/D regions.

6. The semiconductor structure of claim 5, wherein the nFET S/D contact structure is separated from the pFET S/D contact structure by a dielectric material.

7. The semiconductor structure of claim 1, wherein the same work function metal comprises an n-type work function metal.

8. The semiconductor structure of claim 1, wherein the same work function metal comprises a p-type work function metal.

9. The semiconductor structure of claim 1, further comprising a dielectric isolation layer located beneath the pFET device, the dielectric isolation layer is located on a surface of a semiconductor substrate.

10. A semiconductor structure comprising:

a pFET device comprising a first functional gate structure present on physically exposed surfaces, and between, each SiGe channel material nanosheet of a vertical stack of suspended SiGe channel material nanosheets, wherein a SiGe channel material extension region is located at each end of each SiGe channel material nanosheet;

an nFET device stacked vertically above the pFET device and comprising a second functional gate structure present on physically exposed surfaces, and between, each Si channel material nanosheet of a vertical stack of suspended Si channel material nanosheets, wherein a Si channel material extension region is located at each end of each Si channel material nanosheet, and the first and second functional gate structures comprise a same work function metal;

pFET S/D regions present on physically exposed sidewalls of each SiGe channel material extension region;

nFET S/D regions present on physically exposed sidewalls of each Si channel material extension region;

a shared S/D contact structure located on a first side of the vertically stacked nFET and pFET devices, wherein the shared S/D contact structure passes through one of the nFET S/D regions and into one of the pFET S/D regions; and an nFET S/D contact structure and a pFET S/D contact structure located on a second side of the vertically stacked nFET and pFET devices, opposite the first side, wherein the nFET S/D contact structure is present in another of the nFET S/D regions and the pFET contact structure is present in another of the pFET S/D regions.

* * * * *